US009207292B2

(12) United States Patent
Raberg

(10) Patent No.: US 9,207,292 B2
(45) Date of Patent: Dec. 8, 2015

(54) MAGNETORESISTIVE DEVICE AND METHOD FOR MANUFACTURING THE SAME

(75) Inventor: Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 450 days.

(21) Appl. No.: 13/019,510

(22) Filed: Feb. 2, 2011

(65) Prior Publication Data

US 2012/0194180 A1    Aug. 2, 2012

(51) Int. Cl.
| | |
|---|---|
| *G01R 33/09* | (2006.01) |
| *B82Y 25/00* | (2011.01) |
| *G11C 11/00* | (2006.01) |
| *G01R 33/02* | (2006.01) |
| *G01R 33/025* | (2006.01) |
| *G11B 5/66* | (2006.01) |

(52) U.S. Cl.
CPC ............... *G01R 33/093* (2013.01); *B82Y 25/00* (2013.01); *G01R 33/098* (2013.01); *G01R 33/02* (2013.01); *G01R 33/025* (2013.01); *G11B 5/66* (2013.01); *G11C 11/00* (2013.01)

(58) Field of Classification Search
CPC .... G01R 33/093; G01R 33/09; G01R 33/098; G01R 33/07
USPC ..................... 324/252, 228, 207.21
See application file for complete search history.

(56) References Cited

U.S. PATENT DOCUMENTS

| | | | | |
|---|---|---|---|---|
| 4,623,867 A | | 11/1986 | Lundquist et al. | |
| 6,219,205 B1 | | 4/2001 | Yuan et al. | |
| 6,368,706 B1 | * | 4/2002 | Iwasaki | B82Y 10/00 257/E43.004 |
| 6,436,526 B1 | * | 8/2002 | Odagawa | B82Y 10/00 257/E27.005 |
| 6,633,158 B1 | * | 10/2003 | Shen | G01D 5/2515 324/207.13 |
| 6,642,714 B2 | * | 11/2003 | Kobayashi | B82Y 25/00 324/225 |
| 6,664,784 B1 | * | 12/2003 | Hayashi | B82Y 10/00 324/252 |
| 7,301,334 B2 | * | 11/2007 | Shen | H01H 36/002 257/421 |
| 7,382,642 B2 | * | 6/2008 | Boeve | G11C 11/15 365/158 |
| 2003/0173957 A1 | * | 9/2003 | Shen | G01D 5/2515 324/207.26 |
| 2004/0121185 A1 | * | 6/2004 | Fukuzawa | B82Y 10/00 472/815 |
| 2004/0248327 A1 | | 12/2004 | Onaka | |
| 2006/0061916 A1 | * | 3/2006 | Li | B82Y 10/00 360/324.11 |
| 2008/0116885 A1 | | 5/2008 | Van Zon et al. | |
| 2008/0238420 A1 | * | 10/2008 | Haratani | B82Y 25/00 324/252 |
| 2009/0046398 A1 | * | 2/2009 | Werth | B82Y 25/00 324/252 |
| 2009/0058413 A1 | | 3/2009 | Kraemer et al. | |

(Continued)

FOREIGN PATENT DOCUMENTS

| | | |
|---|---|---|
| DE | 3883146 T2 | 3/1994 |
| DE | 602005005620 T2 | 7/2008 |

(Continued)

OTHER PUBLICATIONS

Robert E. Fontana, Jr., Process Complexity of Magnetoresistive Sensors: A Review, IEEE Transactions on Magnetics, vol. 31, No. 6, Nov. 1995, 2579-2584.*

(Continued)

*Primary Examiner* — Jermele M Hollington
*Assistant Examiner* — Christopher McAndrew
(74) *Attorney, Agent, or Firm* — Eschweiler & Associates, LLC

(57) ABSTRACT

A magnetoresistive device includes a carrier, an xMR-sensor, a magnetic layer formed above an active xMR-region of the xMR-sensor and an insulating layer arranged between the xMR-sensor and the magnetic layer.

13 Claims, 13 Drawing Sheets

(56) References Cited

U.S. PATENT DOCUMENTS

| | | | |
|---|---|---|---|
| 2009/0219018 A1* | 9/2009 | Shimazawa | G01R 33/1207 324/210 |
| 2009/0294882 A1* | 12/2009 | Sterling | G01R 33/072 257/427 |
| 2010/0045285 A1 | 2/2010 | Ohmori et al. | |

FOREIGN PATENT DOCUMENTS

| | | |
|---|---|---|
| DE | 112008001414 T5 | 4/2010 |
| JP | S57131078 A | 8/1982 |
| JP | S5816580 A | 1/1983 |
| JP | S59169187 A | 9/1984 |
| JP | H03154389 A | 7/1991 |
| JP | H07270508 A | 10/1995 |
| JP | 2002094140 A | 3/2002 |
| JP | 2004103780 A | 4/2004 |
| JP | 2005285207 A | 10/2005 |
| WO | 2008088021 A1 | 1/2008 |

OTHER PUBLICATIONS

Non Final Office Action Dated Oct. 6, 2015 U.S. Appl. No. 14/848,852.

* cited by examiner

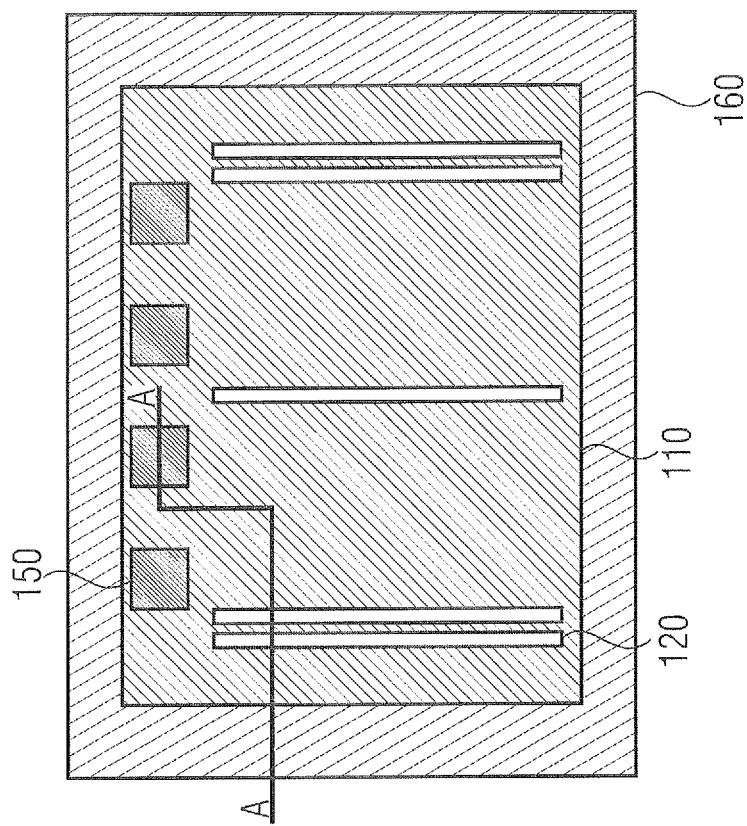
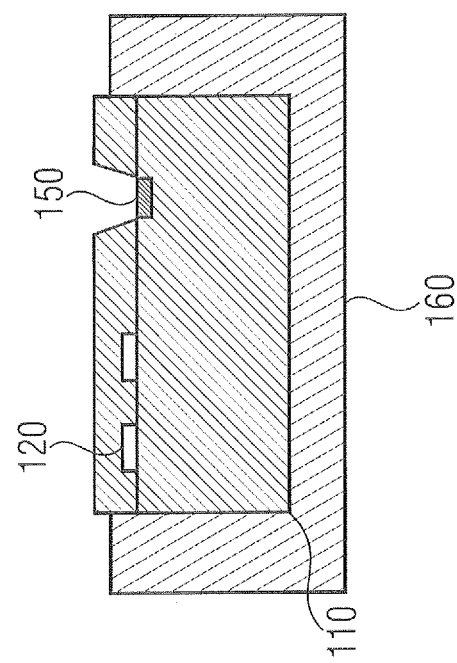
FIG 4B
FIG 4A

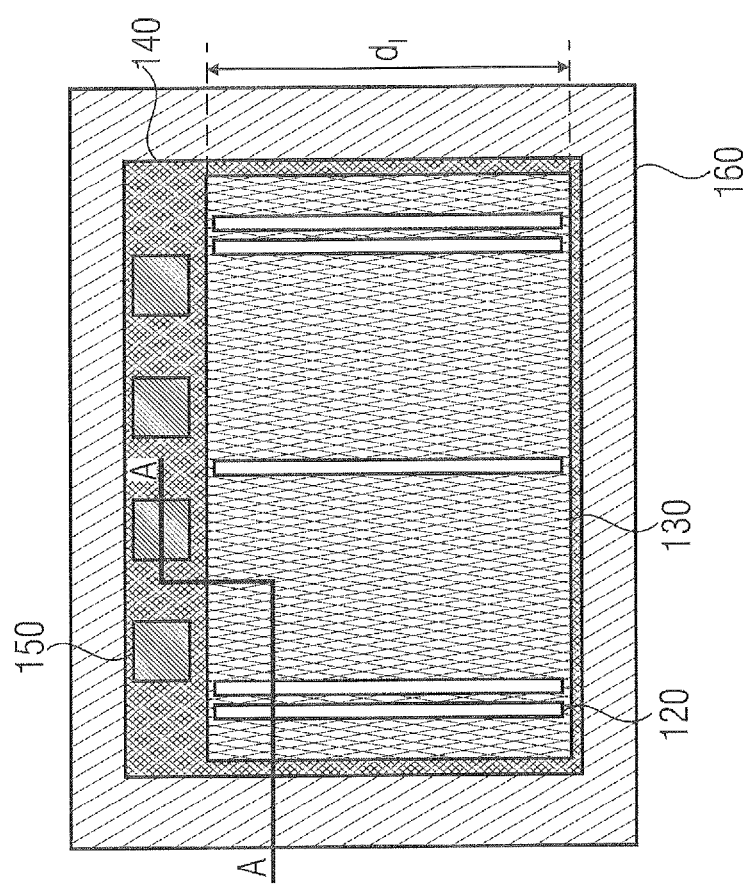
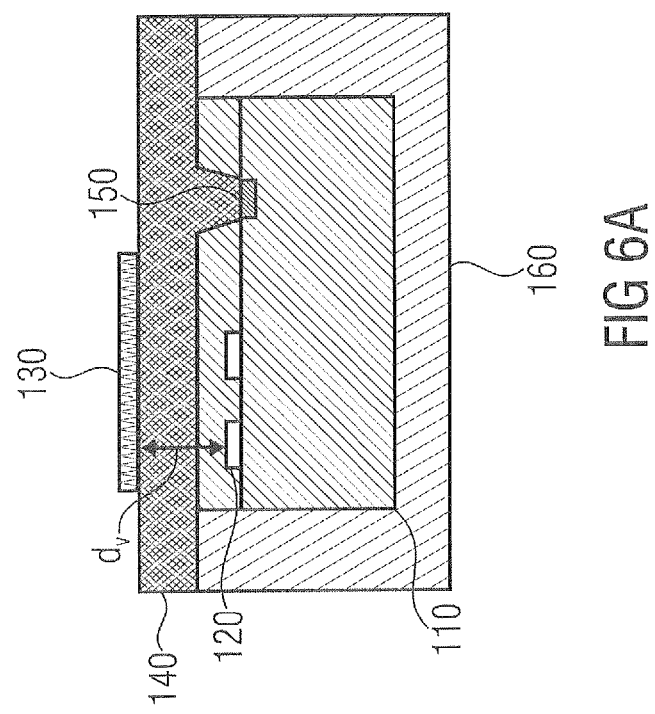
FIG 6B
FIG 6A

US 9,207,292 B2

MAGNETORESISTIVE DEVICE AND METHOD FOR MANUFACTURING THE SAME

FIELD

The invention is directed to a magnetoresistive device and a method for manufacturing the same. Further embodiments of the invention relate to magnetoresistive sensors, which are based on xMR technology, that may be employed in rotational speed sensor applications.

BACKGROUND

Today, speed sensors based on magnetoresistive devices including xMR structures are commonly used for rotational speed sensor applications. Such xMR based speed sensors are employed, for example, with a magnetic pole wheel as a transducer wheel. The magnetoresistive devices based on xMR technology may include xMR structures such as anisotropic magnetoresistance (AMR) structures, giant magnetoresistance (GMR) structures, or tunnel magnetoresistance (TMR) structures.

SUMMARY

Embodiments of the invention provide a magnetoresistive device, comprising a carrier, and an xMR-sensor situated on the carrier. The device further comprises a magnetic layer formed above an active xMR-region of the xMR-sensor, and an insulating layer arranged between the xMR-sensor and the magnetic layer.

Embodiments of the invention provide a magnetoresistive device, comprising a carrier, an xMR-sensor situated on the carrier that is based on an anisotropic magnetoresistance (AMR) effect, a giant magnetoresistance (GMR) effect, or a tunnel magnetoresistance (TMR) effect. The device further comprises a hard magnetic layer formed above an active xMR-region of the xMR-sensor, and an insulating layer arranged between the xMR-sensor and the hard magnetic layer. The hard magnetic layer is configured to provide a bias magnetic field for the active xMR-region of the xMR-sensor from above, and a vertical distance between the xMR-sensor and the hard magnetic layer is smaller than a lateral dimension of the hard magnetic layer.

Embodiments of the invention provide a magnetoresistive device, comprising an xMR-sensor, and means for providing a bias magnetic field for an active xMR-region of the xMR-sensor from a position above the xMR-sensor.

Embodiments of the invention provide a method for manufacturing a magnetoresistive device. The method comprises providing an xMR-sensor, and forming a magnetic layer above an active xMR-region of the xMR-sensor. In one embodiment, the xMR-sensor and the magnetic layer are integrated together to form an integrated circuit type device.

Embodiments of the invention provide a method for manufacturing a magnetoresistive device. The method comprises providing an xMR-sensor based on an anisotropic magnetoresistance (AMR) effect, a giant magnetoresistance (GMR) effect, or a tunnel magnetoresistance (TMR) effect, and forming a hard magnetic layer above an active xMR-region of the xMR-sensor. In addition, the method comprises arranging an insulating layer between the xMR-sensor and the hard magnetic layer, wherein the step of arranging the insulating layer is performed before the step of forming the hard magnetic layer above the active xMR-region of the xMR-sensor.

BRIEF DESCRIPTION OF THE DRAWINGS

FIG. 3b shows a schematic top view of the embodiment of the xMR-wafer in accordance with FIG. 3a;

FIG. 4a shows a schematic cross-sectional view of an embodiment of a manufacturing part of a magnetoresistive device after reconstitution;

FIG. 4b shows a schematic top view of the embodiment of the manufacturing part of the magnetoresistive device in accordance with FIG. 4a;

FIG. 5b shows a schematic top view of the embodiment of the manufacturing part of the magnetoresistive device in accordance with FIG. 5a;

FIG. 6a shows a schematic cross-sectional view of an embodiment of a manufacturing part of a magnetoresistive device after deposition and patterning of a hard magnetic material;

FIG. 6b shows a schematic top view of the embodiment of the manufacturing part of the magnetoresistive device in accordance with FIG. 6a;

FIG. 7b shows a schematic top view of the embodiment of the manufacturing part of the magnetoresistive device in accordance with FIG. 7a;

FIG. 8b shows a view on a By/Bz plane of the embodiment of the xMR speed sensor in accordance with FIG. 8a;

FIG. 9 shows a schematic illustration of a magnetic field rotation across an xMR stripe length when a stripe is positioned in the center of the pole wheel depicted in FIG. 8a;

DETAILED DESCRIPTION

Many of today's xMR based speed sensors are employed with a magnetic pole wheel as a transducer wheel.

Figure 8B:
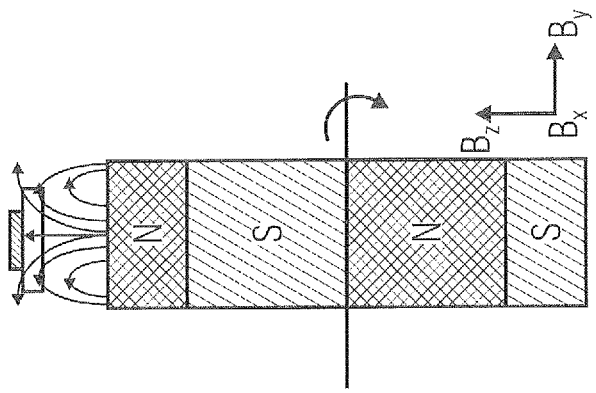
Figure 8A:
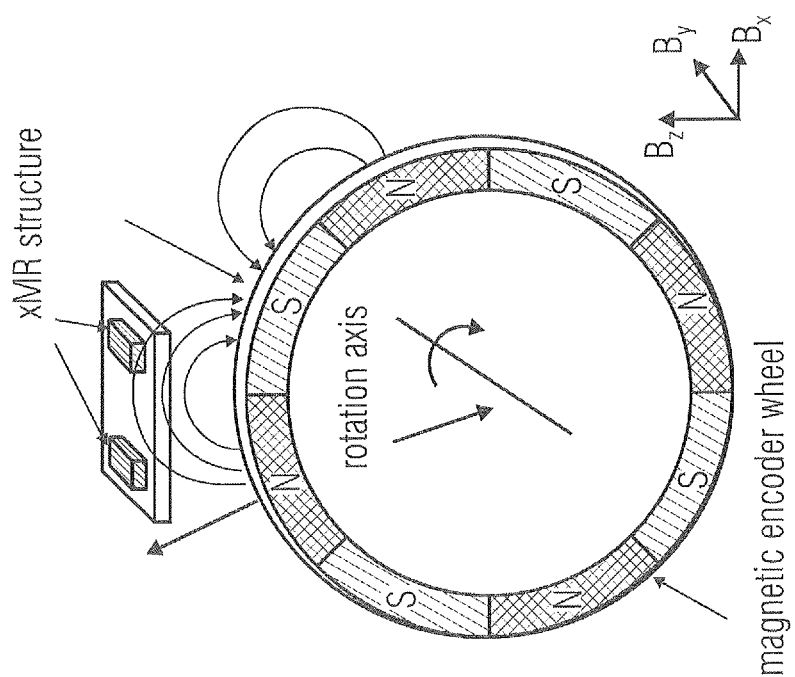
FIG. 8a shows a view on a BX/BZ plane of a schematic setup of an embodiment of an xMR speed sensor in a pole wheel configuration.
Figure 9:
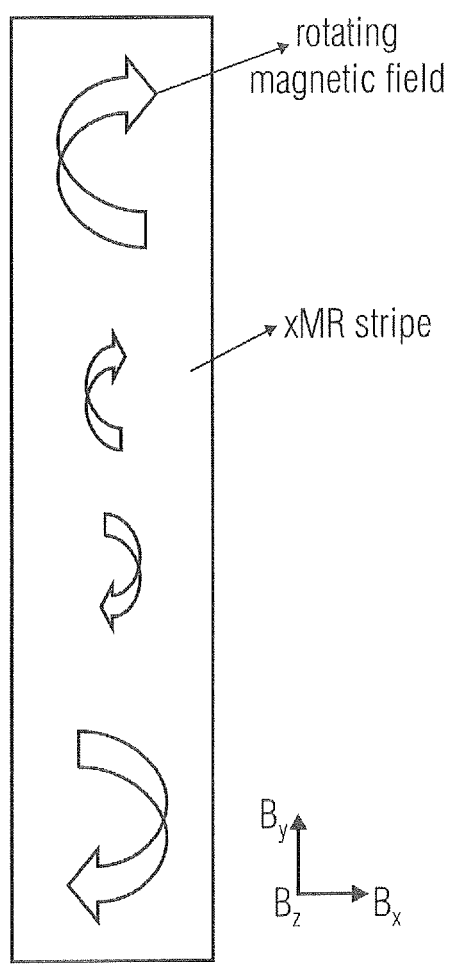

The xMR structures are usually narrow stripes with a homogeneous width of <2 μm in order to provide a defined sensitivity by the shape anisotropy. To achieve a reasonable xMR resistance in the range of 10 kOhms, the stripe is several 100 µm long. The transducer pole wheels have only a limited thickness/axial width and therefore, the magnetic signal field is not homogeneous over the whole stripe length. With growing (axial) distance from the pole wheel center, the By component increases and is phase shifted by 180° between the lower and upper half of the pole wheel (see, e.g., FIGS. 8a,8b and 9). In combination with a Bx component which is phase shifted by +/−90° to the individual By components, this results in a rotation of the magnetic field vector.

Figure 10:
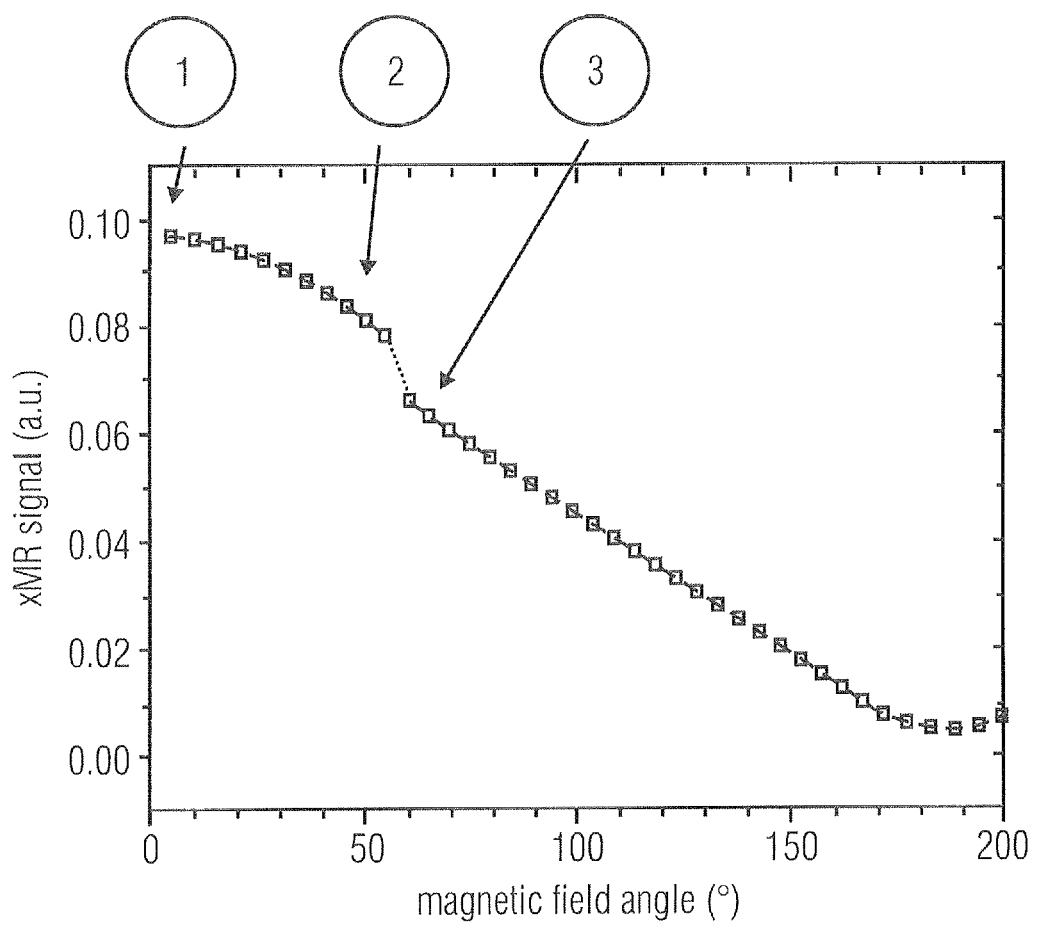
FIG. 10 shows a graph of a simulated xMR response upon rotation of a rotating magnetic field, illustrating a characteristic discontinuity.
Figure 11A:
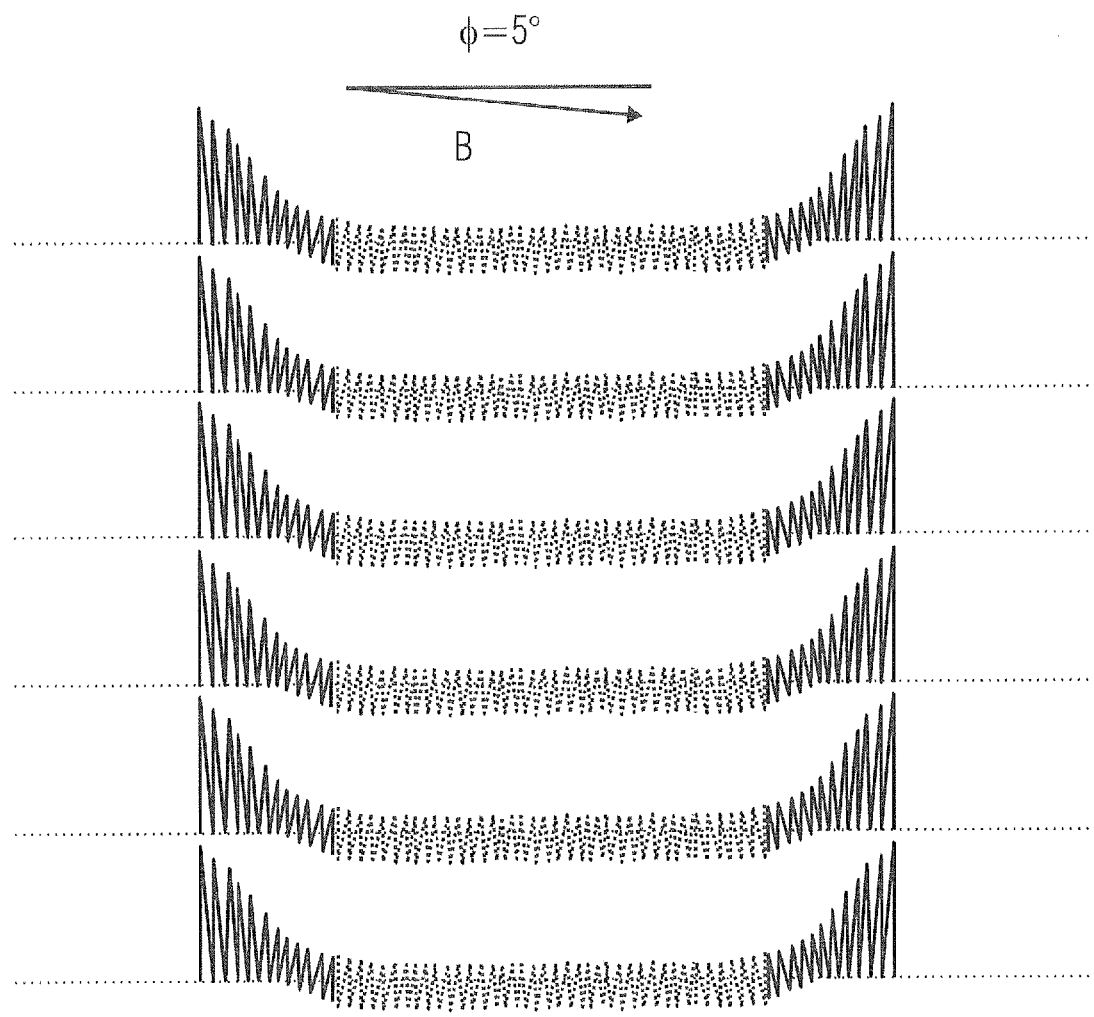
FIG. 11a shows a bird's view on simulated magnetization regions of the free layer of an xMR stripe for a magnetic field angle of 5° corresponding to point 1 in FIG. 10.
Figure 11B:
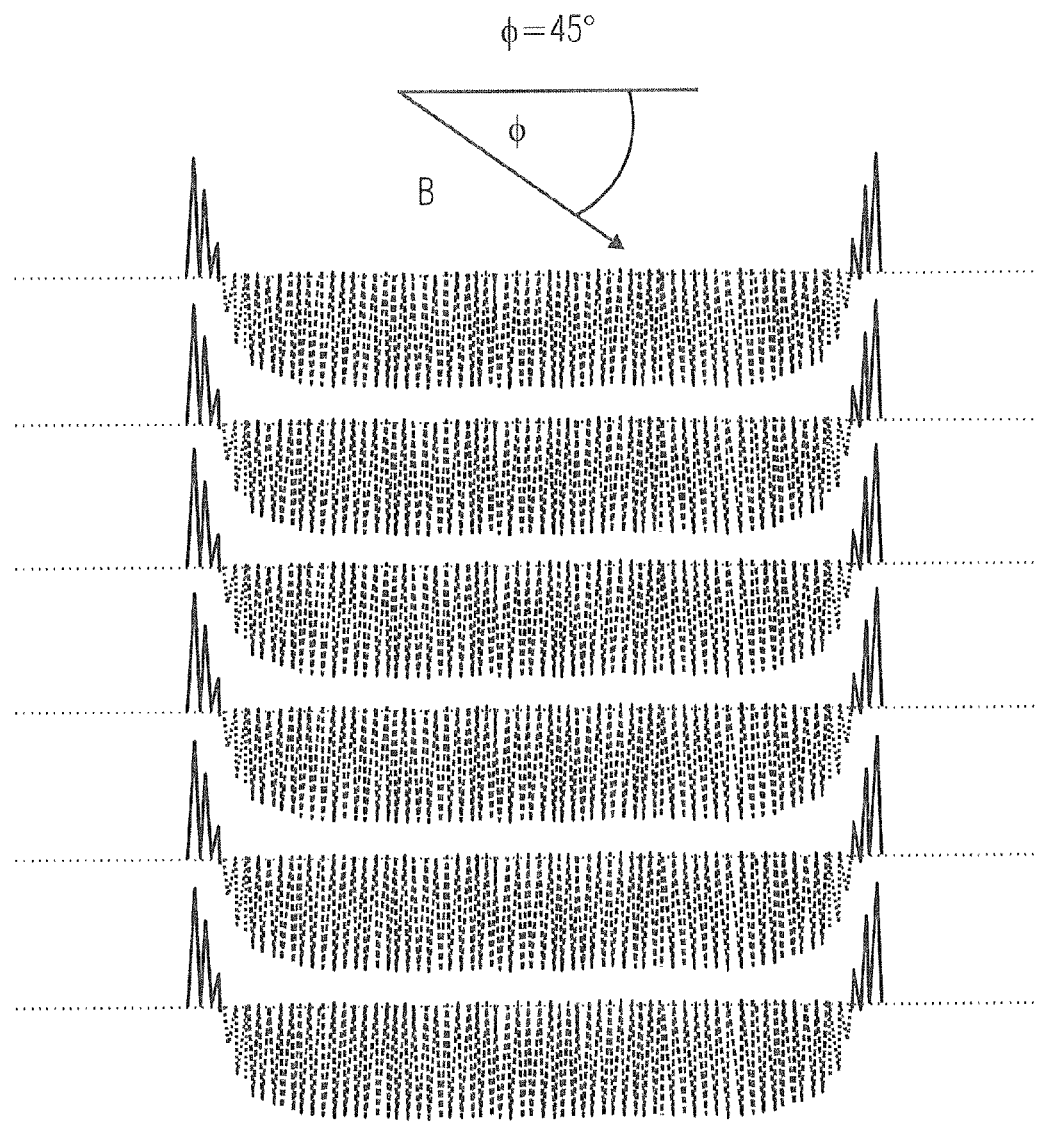
FIG. 11b shows a bird's view on simulated magnetization regions of the free layer of an xMR stripe for a magnetic field angle of 45° corresponding to point 2 in FIG. 10.
Figure 11C:
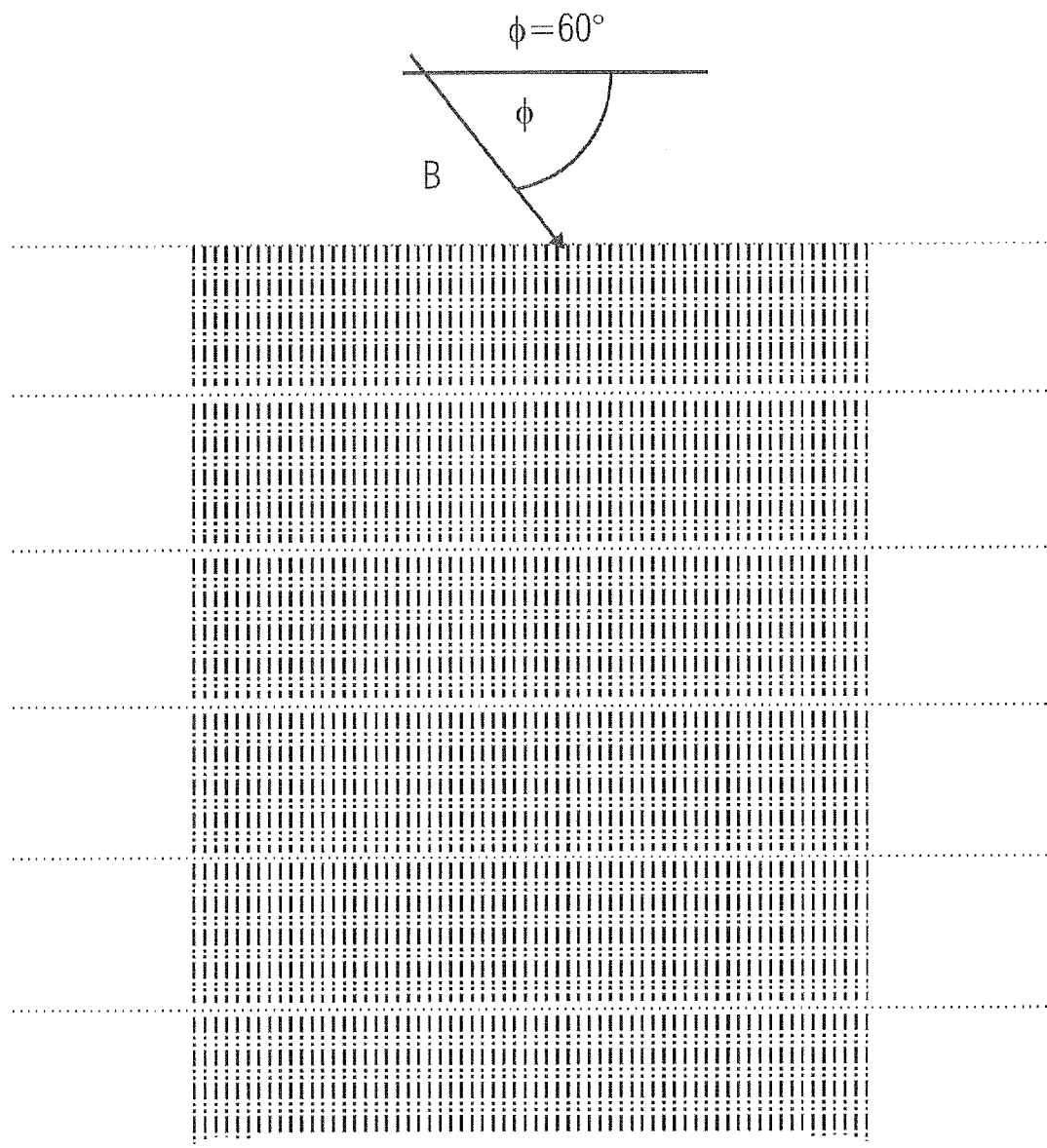
FIG. 11c shows a bird's view on simulated magnetization regions of the free layer of an xMR stripe for a magnetic field angle of 60° corresponding to point 3 in FIG. 10.

The shape anisotropy results in a different behavior of the magnetizations over the stripe width: whereas the domains in the center can follow quite easily an external magnetic field, the magnetization regions at the edges are much more stable. FIGS. 11a,11b, and 11c show a bird's eye view on the simulated magnetization of the free layer (i.e. sensor layer) of the xMR stack upon exposure to an external rotating field with Bx=By=8 mT. The rotation starts at phi=0° with the magnetic field pointing to the right. At phi=5° (point 1 in FIG. 10) the center magnetization region can follow whereas the edge regions keep their magnetization in the initial direction in the upper half space. A further clockwise rotation (phi=45° corresponding to point 2 in FIG. 10) leads to a generation of 180° domain walls between the magnetizations of the stripe center and the edge. At around phi=60° rotation angle (corresponding to point 3 in FIG. 10) the force on the edge regions is strong enough to turn their magnetization direction along the external field. This switching process is reflected in a discontinuity in the resistance characteristic (see FIG. 10). FIG. 10 shows an example graph of a simulated xMR response upon exposure to a rotating magnetic field (B=8 mT). Referring to FIG. 10, a discontinuity in the characteristic can be observed between field angles of 55° and 60°. The field angle where the switching occurs depends on the field conditions (By/Bx ratio) of the rotating field vector and the shape anisotropy and therefore, the stripe width.

The discontinuity in the output signal CaO heavily affect the interpretation of the signal (jitter, pulse lost, etc.)

According to the prior art, methods for creating a uni-axial bias magnetic field for stabilizing the direction of free layer magnetization exist. By using such a bias field, discontinuities in the output signal generated by rotating free layer magnetization can be prevented or at least reduced. Known methods to create such a bias field employ, for example, the use of a hard magnetic bias material at the edges of the sensor layer, the exchange biasing of the free layer with a natural antiferromagnet, or the mounting of a bias magnet to the back of the sensor.

In particular, the use of a hard magnetic bias material at the edges of the sensor layer can be used only for very short devices, while the exchange biasing of the free layer with a natural antiferromagnet typically creates a rather large bias field. In addition, the method of mounting a bias magnet to the back of the sensor is rather complex and increases the cost of manufacturing the device and increases its size.

Therefore, a need exists for an improved concept of a magnetoresistive device, which, on the one hand, allows for a compact and flexible structure and, on the other hand, allows for a less complex and cost-effective manufacturing of the same.

Embodiments of the invention provide a compact and flexible structure that can be achieved if a magnetic layer is formed above an active xMR-region of the xMR-sensor. By this measure, disadvantages in terms of complexity, cost and size may be overcome, thereby realizing an improved concept of a compact and flexible magnetoresistive device.

Figure 1:
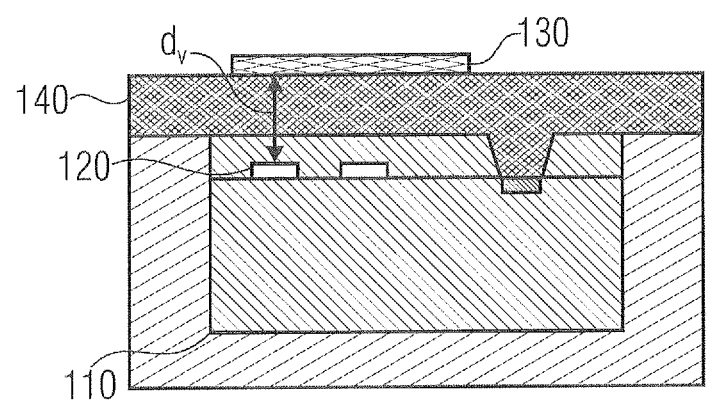
FIG. 1 shows a schematic cross-sectional view of a magnetoresistive device according to an embodiment of the present invention.

FIG. 1 shows a schematic cross-sectional view of a magnetoresistive device 100 according to an embodiment of the present invention. As shown in FIG. 1, the magnetoresistive device 100 comprises a carrier 110, an xMR-sensor 120, a magnetic layer 130 and an insulating layer 140. Here, the magnetic layer 130 is formed above an active xMR-region of the xMR-sensor 120. In addition, the insulating layer 140 is arranged between the xMR-sensor 120 and the magnetic layer 130.

The xMR-sensor 120 of the magnetoresistive device 100 can, for example, be based on an anisotropic magnetoresistance (AMR) effect, a giant magnetoresistance (GMR) effect, or a tunnel magnetoresistance (TMR) effect. It can be seen in FIG. 1 that the magnetoresistive device 100 may also comprise two or more xMR-sensors which are arranged next to each other on the carrier 110. The two or more xMR-sensors can be used in one embodiment to detect a gradient of an externally applied magnetic field.

The carrier 110 of the magnetoresistive device 100 can, for example, be a semiconductor substrate made of silicon.

In the embodiment of FIG. 1, the magnetic layer 130 of the magnetoresistive device 100 is configured to provide a bias magnetic field for the active xMR-region of the xMR-sensor 120 from above. This essentially can be achieved by forming the magnetic layer 130 above the active xMR-region of the xMR-sensor 120. The presented measure allows for an improved functionality of the magnetoresistive device and provides an easier usage, handling and manufacturing of the same.

Thus, according to the embodiment of FIG. 1, the magnetic layer is configured to provide a bias magnetic field for the active xMR-region of the xMR-sensor from above.

According to embodiments of the present invention, the magnetic layer 130 of the magnetoresistive device 100 may be configured as a hard magnetic layer or a soft magnetic layer. The hard magnetic layer, for example, can be made of a hard magnetic material comprising SmCo, hard ferrite or NdFeB. The soft magnetic layer, for example, can be made of a soft magnetic material exchange biased by a natural antiferromagnet.

Referring to the embodiment of FIG. 1, the vertical distance $d_v$ between the xMR-sensor 120 and the magnetic layer 130 lies within a range of approximately 1 to 100 µm, preferably 3 to 10 µm. Because of this small vertical distance, the bias magnetic field provided by the magnetic layer 130 can be generated in direct vicinity to the xMR-sensor 120 of the magnetoresistive device 100.

According to further embodiments, the magnetic layer 130 is configured as a hard magnetic layer having a magnetization direction along the direction of the easy axis of the xMR-sensor 120. In this way, it can be insured that a bias magnetic field will be generated from the hard magnetic layer in the active xMR-region of the xMR-sensor 120 along the easy axis of the xMR-sensor 120.

In particular, the hard magnetic layer 130 can be provided with a magnetization, a thickness and a vertical distance $d_v$ from the xMR-sensor 120 such that a strength of the bias magnetic field generated along the easy axis of the xMR-sensor 120 will be between approximately 2 and 10 mT.

As a consequence, the strength of the bias magnetic field generated along the easy axis of the xMR-sensor can be variably adjusted, so that a rotating free layer magnetization in the active xMR-region of the xMR-sensor can be avoided or at least minimized, thereby reducing discontinuities in the output signal of the xMR-sensor. It is pointed out here that the bias magnetic field to be generated along the easy axis of the xMR-sensor can be applied to stabilize the direction of the free layer magnetization without having to increase the complexity, cost and size of the magnetoresistive device.

Figure 2:
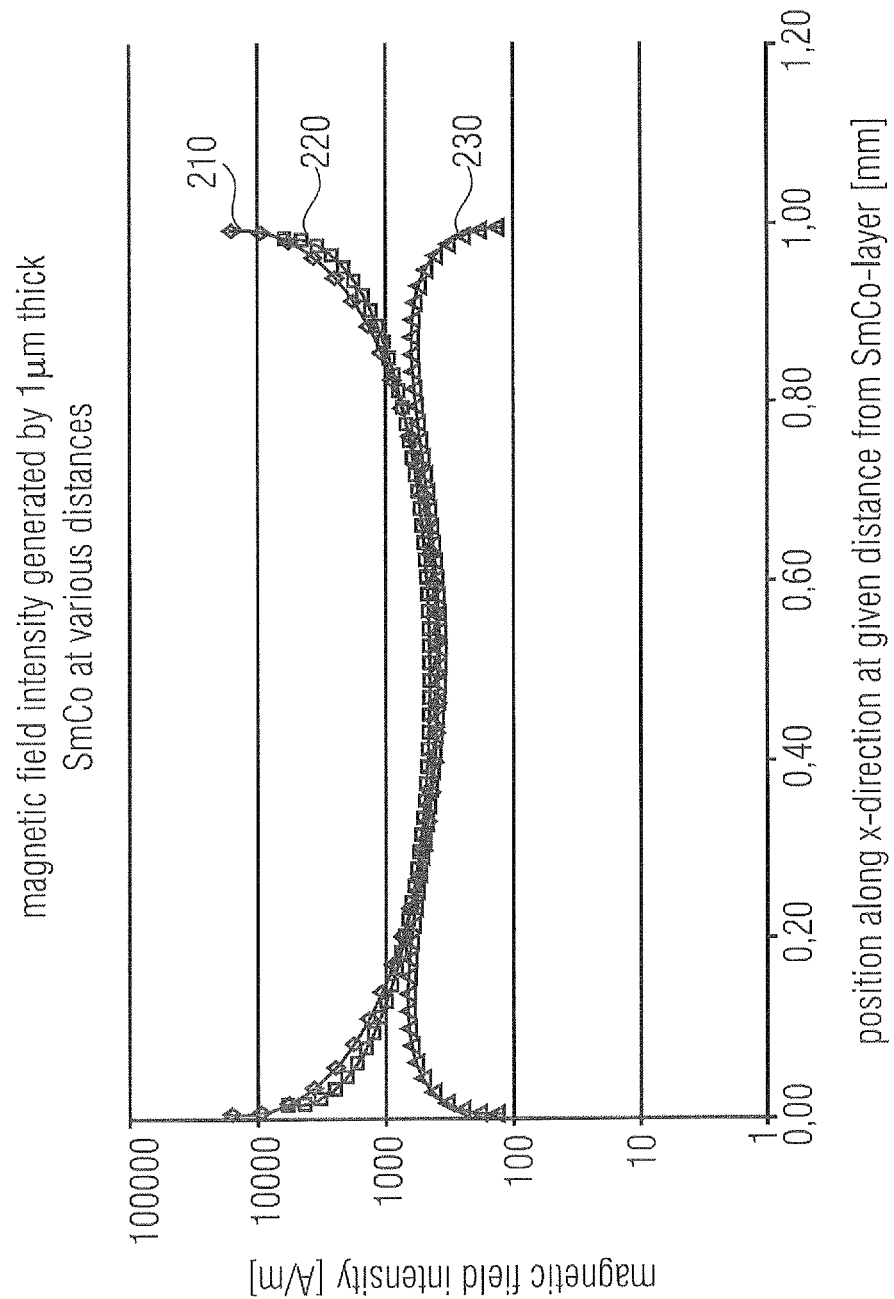
FIG. 2 shows a graph of an example magnetic field intensity generated at the location of an xMR-sensor of the embodiment of the magnetoresistive device in accordance with FIG. 1.

FIG. 2 shows a graph of an example magnetic field intensity generated at the location of an xMR-sensor of the embodiment of the magnetoresistive device in accordance with FIG. 1. In particular, three curves 210, 220, and 230 of the magnetic field intensity generated by a 1 µm thick SmCo-layer (hard magnetic layer) at various distances are shown in FIG. 2. The vertical axis of the graph represents the magnetic field intensity (1 mT~796 A/m), while the horizontal axis of the graph represents the position at a lateral direction or the x-direction at a given distance from the SmCo-layer. Here, the 1 µm thick SmCo-layer may correspond to the magnetic layer 130 of the magnetoresistive device 100 as shown in FIG. 1. The various distances associated with the different curves 210 220, and 230 in the graph of FIG. 2 may correspond to different vertical distances $d_v$ (e.g., 1 µm, 10 µm and 100 µm, respectively) between the xMR-sensor 120 and the magnetic layer 130 of the magnetoresistive device 100. It can be seen clearly in FIG. 2 that the three curves 210, 220, and 230 of the magnetic field intensity are nearly identical within a range of approximately 0.2-0.8 mm, while they significantly deviate from each other outside of this range. It is to be noted that the magnetic field intensity is plotted with a logarithmic scale here. The characteristic behavior of the different curves 210, 220, and 230 shows that the generated magnetic field intensity is not influenced substantially by variations in the distance between the xMR-sensor and the magnetic layer. Therefore, the magnetoresistive device can be made robust against such variations in the distance.

Thus, referring to FIG. 2, the simulation shows little influence in the field intensity up to vertical distances d, of 100 µm. In embodiments of the present invention, the vertical distance $d_v$ is between approximately 1 to 100 µm, preferably between 3 to 10 µm.

According to further embodiments of the present invention, a method for manufacturing a magnetoresistive device may comprise the following steps. First, an xMR-sensor is provided. Then, a magnetic layer is formed above an active xMR-region of the xMR-sensor. Here, it is pointed out that the xMR-sensor may be provided on top of an CMOS circuitry in one embodiment, essentially representing an integrated sensor.

According to further embodiments, the method for manufacturing the magnetoresistive device may further comprise arranging an insulating layer between the xMR-sensor and the magnetic layer. Here, the step of arranging the insulating layer is performed before the step of forming the magnetic layer above the active xMR-region of the xMR-sensor.

Moreover, the magnetoresistive device obtained from the manufacturing process including the xMR-sensor, the magnetic layer and the insulating layer may correspond to the magnetoresistive device 100 including the xMR-sensor 120, the magnetic layer 130 and the insulating layer 140, respectively.

FIGS. 3a, 3b-7a, 7b show schematic cross-sectional views and corresponding top views of embodiments of manufacturing parts of a magnetoresistive device obtained after different steps in the manufacturing process.

Referring to FIGS. 3a, 3b-7a, 7b, the procedure for manufacturing the magnetoresistive device according to one embodiment of the present invention is briefly described in the following. Here, the cross-sectional views of FIGS. 3a-7a are taken along the lines A-A in FIGS. 3b-7b, while the top views of FIGS. 3b-7b shows the structures of FIGS. 3a-7a adjacent to each other.

Figure 3B:
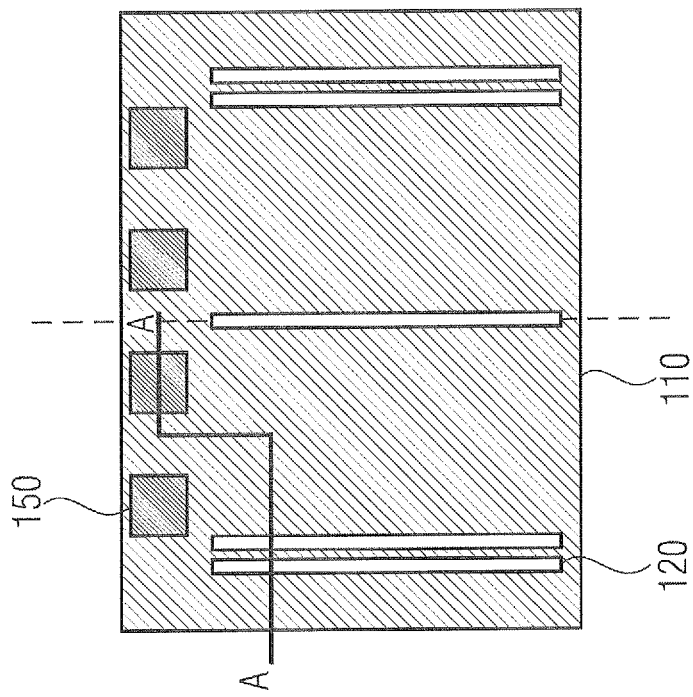
Figure 3A:
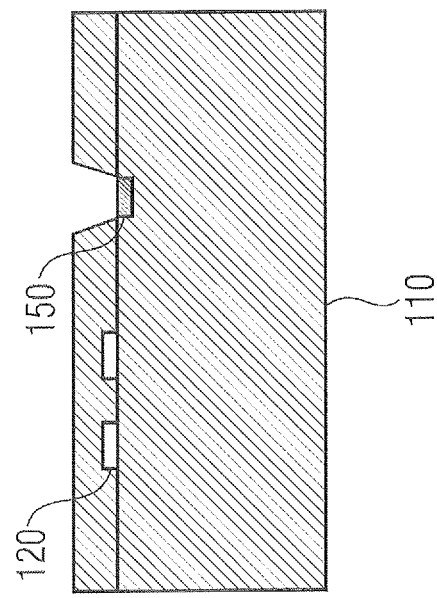
FIG. 3a shows a schematic cross-sectional view of an embodiment of an xMR-wafer present after an FE-(Front-End) process and grinding.

First, an xMR-wafer or GMR-wafer is processed through the FE (Front-End) in a standard way and then thinned down. Thinning down the xMR-wafer can be achieved by a grinding process in one embodiment. As a starting point, the xMR-wafer after the FE-process and the grinding is obtained, is shown in FIG. 3a or 3b, respectively. In FIGS. 3a and 3b, the carrier 110, such as an Si-chip including CMOS circuitry, and one or more xMR-sensors 120, such as a GMR-sensor, are depicted. Moreover, an opening and a contact pad 150 may be provided onto or into the carrier 110.

After this, in one embodiment the xMR-chips are singulated, placed on a foil and reconstituted to a wafer-like substrate using a mold compound. FIGS. 4a and 4b show the processing result after the reconstitution. In particular, a mold 160 is depicted in FIGS. 4a and b surrounding the carrier 110.

Figure 5B:
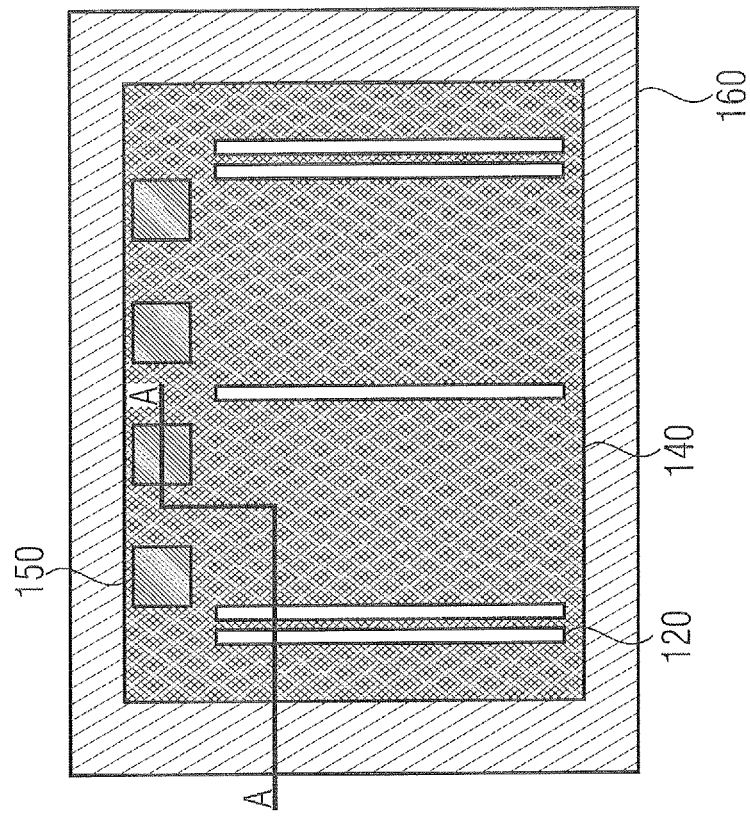
Figure 5A:
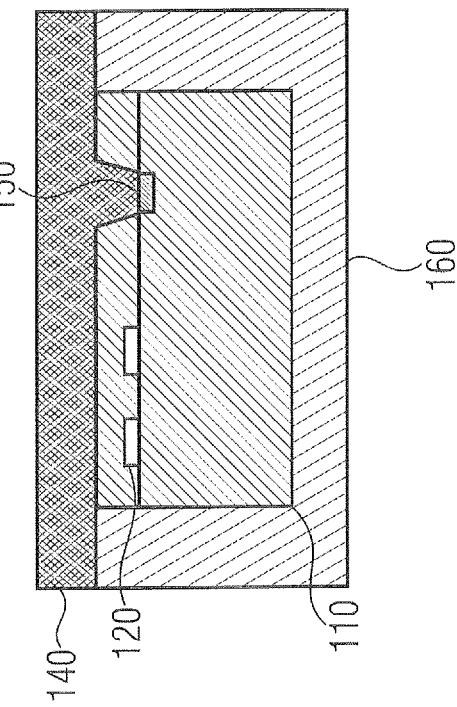
FIG. 5a shows a schematic cross-sectional view of an embodiment of a manufacturing part of a magnetoresistive device after deposition of a first dielectric layer.

After removal of the foil, an insulating layer 140 or dielectric layer is deposited on top of the passivation layer or photoimide with a thickness ranging between 3-10 µm. The processing result after deposition of the insulating layer 140 or the first dielectric layer with a thickness of e.g. 5 µm is depicted in FIG. 5a or 5b, respectively. As can be seen in FIGS. 5a and 5b, the insulating layer 140 covers the carrier 110 completely and extends within an area defined by an inner perimeter of the mold 160. In other words, the step of arranging the insulating layer comprises depositing a dielectric layer having a thickness between 3 and 10 µm.

Subsequently, a magnetic layer 130 such as a hard magnetic layer made, e.g., of SmCo, NdFeB or hard ferrite is formed above the active xMR-region of the xMR-sensor 120 such that the field generated by this layer 130 at the location of the xMR-sensors 120 or xMR-elements is along the easy axis of the xMR-sensors or xMR-elements and has a strength of between 2 mT and 10 mT. This, for example, can be achieved by an SmCo layer with a thickness of approximately 3 µm. The processing result of a deposition and patterning of a hard magnetic material (e.g. a 3 µm thick hard magnetic SmCo-layer) is depicted in FIGS. 6a and 6b, respectively. It can be seen from FIGS. 6a and 6b that the magnetic layer 130 is formed above an active xMR-region of the xMR-sensor 120, wherein a vertical distance $d_v$ between the xMR-sensor 120 and the magnetic layer 130 is smaller than a lateral dimension of the magnetic layer 130. As has been described with reference to FIG. 2, an advantage of such a configuration is that variations in the distance between the xMR-element and the hard magnetic layer have a negligible effect as long as the distance is small compared to the lateral dimension of the bias layer.

Thus, according to the embodiment described above, a vertical distance between the xMR-sensor and the magnetic layer is smaller than a lateral dimension of the magnetic layer. In this way, it is possible to avoid an influence of variations in the distance between the xMR-sensor and the magnetic layer on the performance reliability of the magnetoresistive device.

Figure 7B:
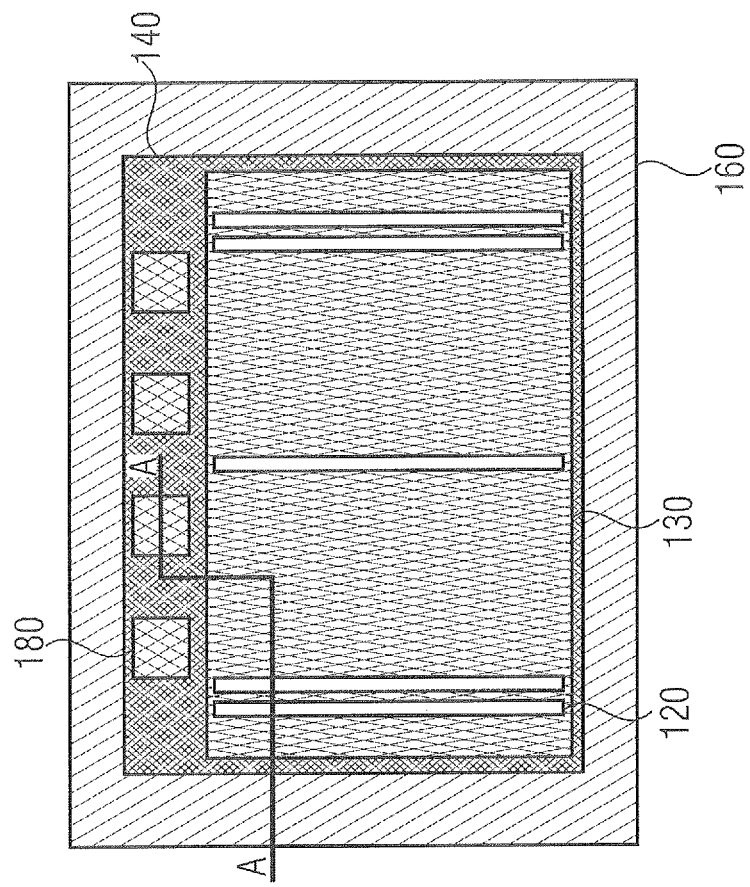
Figure 7A:
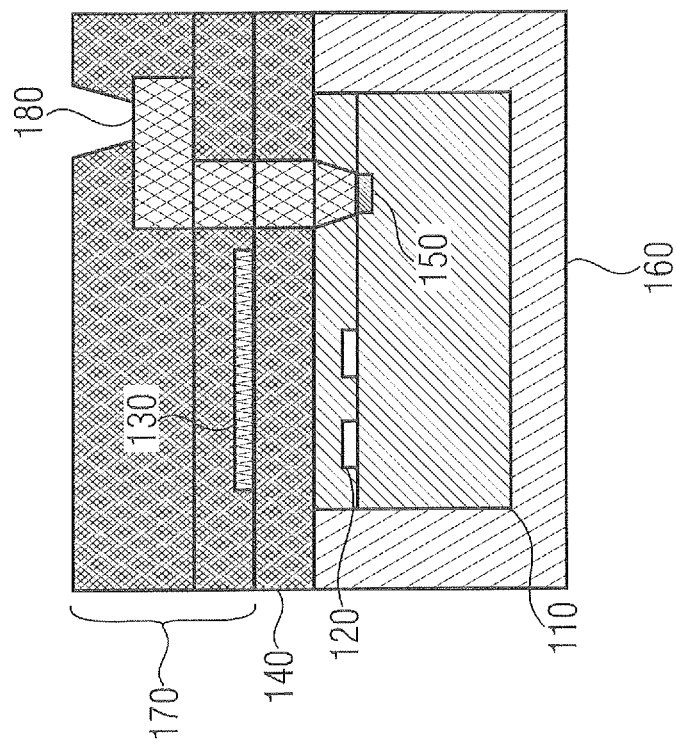
FIG. 7a shows a schematic cross-sectional view of an embodiment of a manufacturing part of a magnetoresistive device after patterning of a redistribution metal, deposition of a final dielectric layer and an opening.

Following the formation of the magnetic layer 130 or bias layer, another dielectric layer, a redistribution metal layer and a final dielectric layer (structure 170) are deposited. The processing result after patterning of the redistribution metal, deposition of a final dielectric layer (third ILD, Inter-Layer Dielectric) and an opening is shown in FIG. 7a or 7b, respectively. Referring to FIGS. 7a and 7b, an opening in the final dielectric layer and a via 180 filled, for example, with a metallic material are provided, thereby realizing an electrical contact with the pad 150.

The example process flow described with reference to FIGS. 3a, 3b-7a, 7b can advantageously be used for manufacturing of a magnetoresistive device with a reduced process complexity, cost and size.

Embodiments of the present invention provide the advantage that discontinuities in the output signal generated by a rotating free layer magnetization can be prevented or at least reduced. Moreover, disadvantages in terms of process complexity, cost and size of the resulting sensor device can be avoided.

Embodiments of the present invention provide a concept for creating a uni-axial bias field along the easy axis of an xMR-sensor without significant costs added and without change of the final sensor device.

The present invention provides this concept by creating bias fields in the extreme vicinity of the xMR-sensor elements after finishing the standard wafer process of the integrated device. This vicinity can be achieved by employing a wafer level approach to create a magnetic layer or intermediate layer on the face side of the xMR-sensor, which contains, e.g. a thin hard magnetic material (electro-deposited or sputtered) or a soft magnetic layer, exchange biased by a natural anti-ferromagnet.

An advantage of the method according to an embodiment of the present invention is that the magnetic layer or intermediate layer (bias layer or biasing layer) allows one to create a magnetic bias field in direct vicinity to the sensor layer or free layer, thereby significantly reducing the amount of material needed.

Embodiments of the present invention also provide the advantage that the bias field can be tuned easily by varying the thickness of the (biasing) layer. In addition, variations in the distance between biasing layer and sensor have negligible influence. In embodiments of the present invention, no modification of the sensor element itself is required, so that no influence on the reliability of the device is to be expected.

The present invention provides a very cost-effective solution due to the application of semiconductor methodology. Embodiments of the present invention provide a design of a bias layer which easily can be changed via lithography.

As opposed to the prior art, it has been found that no significant changes to the integration process have to be made if the process is performed in the presented way. Embodiments of the present invention provide an add-on process flow that can be performed without consideration of the integration technology used for the sensor element itself and, specifically, for integrated CMOS and xMR-sensors.

Embodiments of the invention are not restricted in flexibility and efficiency and are advantageous in terms of complexity, cost and size.

In summary, the present invention is realized by utilizing a wafer level approach to create a biasing layer in direct vicinity to the xMR-elements. This can, for example, be achieved by adding a dedicated metallization level on top of the xMR-sensor wafer or by utilizing an eWLB (embedded Wafer Level Ball Grid Array) approach.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A magnetoresistive device, comprising:
a carrier;
an xMR-sensor formed on or in the carrier, the xMR-sensor based on an anisotropic magnetoresistance (AMR) effect, a giant magnetoresistance (GMR) effect, or a tunnel magnetoresistance (TMR) effect;
a hard magnetic layer distinct from the xMR-sensor and formed above an active xMR-region of the xMR-sensor; and
an insulating layer distinct from the xMR-sensor and arranged between the xMR-sensor and the hard magnetic layer,
wherein the hard magnetic layer is configured to provide a bias magnetic field in the active xMR-region of the xMR-sensor from a position above the xMR-sensor along the easy axis of the xMR-sensor, and
wherein a vertical distance between the xMR-sensor and the hard magnetic layer is smaller than a lateral dimension of the hard magnetic layer.

2. A method for manufacturing a magnetoresistive device, the method comprising:
providing an xMR-sensor on or in a carrier; and
forming a magnetic layer distinct from the xMR-sensor and above an active xMR-region of the xMR-sensor, wherein the magnetic layer and the xMR-sensor are integrated together to form an integrated circuit type device,
wherein the magnetic layer distinct from the xMR-sensor is configured to provide a bias magnetic field in the active xMR-region of the xMR-sensor from a position above the xMR-sensor along the easy axis of the xMR-sensor.

3. The method according to claim 2, further comprising:
arranging an insulating layer between the xMR-sensor and the magnetic layer, wherein the step of arranging the insulating layer is performed before forming the magnetic layer above the active xMR-region of the xMR-sensor.

4. The method according to claim 3, wherein arranging the insulating layer comprises depositing a dielectric layer having a thickness between 3 and 10 μm.

5. The method of claim 3, wherein a thickness of the insulating layer defines a vertical distance between the magnetic layer and the xMR-sensor, and wherein the vertical distance is smaller than a lateral dimension of the magnetic layer.

6. The method according to claim 2, wherein forming the magnetic layer comprises electrodepositing or sputtering the hard magnetic layer having a thickness of approximately 3 μm.

7. A method for manufacturing a magnetoresistive device, the method comprising:
providing an xMR-sensor on or in a carrier based on an anisotropic magnetoresistance (AMR) effect, a giant magnetoresistance (GMR) effect, or a tunnel magnetoresistance (TMR) effect;
forming a hard magnetic layer distinct from the xMR-sensor and above an active xMR-region of the xMR-sensor; and
arranging an insulating layer distinct from the xMR-sensor between the xMR-sensor and the hard magnetic layer,
wherein arranging the insulating layer is performed before forming the hard magnetic layer above the active xMR-region of the xMR-sensor, and
wherein the magnetic layer distinct from the xMR-sensor is configured to provide a bias magnetic field in the active xMR-region of the xMR-sensor from a position above the xMR-sensor along the easy axis of the xMR-sensor.

8. The method of claim 7, wherein the hard magnetic layer, the insulating layer and the xMR-sensor are integrated together to form an integrated circuit type device.

9. The method of claim 7, wherein a thickness of the insulating layer defines a vertical distance between the hard magnetic layer and the xMR-sensor, and wherein the vertical distance is smaller than a lateral dimension of the hard magnetic layer.

10. The magnetoresistive device of claim 1, wherein the magnetic layer comprises a hard magnetic layer, and wherein a magnetization direction of the hard magnetic layer is along a direction of an easy axis of the xMR-sensor such that a bias magnetic field is generated from the hard magnetic layer in the active xMR-region of the xMR-sensor along the easy axis of the xMR- sensor.

11. The magnetoresistive device of claim 1, the hard magnetic layer having a magnetization direction along a direction of an easy axis of the xMR-sensor such that a bias magnetic field is generated from the hard magnetic layer in the active xMR-region of the xMR-sensor along the easy axis of the xMR-sensor.

12. The method of claim 2, wherein the magnetic layer comprises a hard magnetic layer, and wherein a magnetization direction of the hard magnetic layer is along a direction of an easy axis of the xMR-sensor such that a bias magnetic field is generated from the hard magnetic layer in the active xMR-region of the xMR-sensor along the easy axis of the xMR-sensor.

13. The method of claim 7, the hard magnetic layer having a magnetization direction along a direction of an easy axis of the xMR-sensor such that a bias magnetic field is generated from the hard magnetic layer in the active xMR-region of the xMR-sensor along the easy axis of the xMR-sensor.

* * * * *